United States Patent [19]

O'Shaughnessy et al.

[11] Patent Number: 5,296,302

[45] Date of Patent: Mar. 22, 1994

[54] ABRASION-RESISTANT OVERCOAT FOR COATED SUBSTRATES

[75] Inventors: Roger O'Shaughnessy, Chaska, Minn.; Robert Bond, Spring Green, Wis.

[73] Assignee: Cardinal IG Company, Minnetonka, Minn.

[21] Appl. No.: 859,574

[22] Filed: Mar. 27, 1992

[51] Int. Cl.⁵ .................................................. H05B 3/10
[52] U.S. Cl. .................................... 428/472; 359/359; 359/585; 428/336; 428/426; 428/432; 428/433; 428/697; 428/701
[58] Field of Search ............... 428/432, 433, 426, 336, 428/697, 701, 472; 359/585, 359

[56] References Cited

U.S. PATENT DOCUMENTS

| Re. 27,473 | 9/1972 | Mauer | 359/360 |
|---|---|---|---|
| 3,758,185 | 9/1973 | Gelber | 359/585 |
| 3,889,026 | 6/1975 | Groth | 428/34 |
| 3,978,272 | 8/1976 | Donley | 428/469 |
| 4,045,125 | 8/1977 | Farges | 359/585 |
| 4,179,181 | 12/1979 | Chang | 350/1.7 |
| 4,462,883 | 7/1984 | Hart | 428/621 |
| 4,497,700 | 2/1985 | Groth et al. | 428/432 |
| 4,532,181 | 7/1985 | Brill et al. | 428/336 |
| 4,594,137 | 6/1986 | Gillery et al. | 428/432 |
| 4,639,069 | 1/1987 | Yatabe et al. | 427/160 |
| 4,716,086 | 12/1987 | Gillery et al. | 428/630 |
| 4,786,563 | 11/1988 | Gillery et al. | 428/630 |
| 4,790,922 | 12/1988 | Huffer | 428/432 |
| 4,799,745 | 1/1989 | Meyer et al. | 350/1.7 |
| 4,891,113 | 1/1990 | Criss | 204/192.15 |
| 4,898,789 | 2/1990 | Finley | 428/623 |
| 4,898,790 | 2/1990 | Finley | 428/432 |
| 4,902,081 | 2/1990 | Huffer | 359/360 |
| 4,902,580 | 2/1990 | Gillery | 428/623 |
| 4,902,581 | 2/1990 | Criss | 428/627 |
| 4,960,310 | 10/1990 | Cushing | 228/32 |
| 5,028,759 | 7/1991 | Finley | 219/203 |
| 5,073,450 | 12/1991 | Neitering | 428/336 |
| 5,073,451 | 12/1991 | Iida et al. | 428/336 |

FOREIGN PATENT DOCUMENTS

| 554729 | 12/1985 | Australia . |
| 0183052 | 6/1986 | European Pat. Off. . |
| 0304234 | 2/1989 | European Pat. Off. . |
| 9005439 | 5/1990 | PCT Int'l Appl. . |
| 1270586 | 4/1972 | United Kingdom . |
| 2201428 | 9/1988 | United Kingdom . |

Primary Examiner—A. A. Turner
Attorney, Agent, or Firm—Fredrikson & Byron

[57] ABSTRACT

The present invention provides a high transmittance, low emissivity film stack having an overcoat of an oxide of a metal chosen from the group of zinc, tin, indium, or bismuth, or an alloy including one or more of these metals, the oxide being applied in a thickness sufficiently low as to have no significant affect upon the optical properties of the coated substrate. That is, if the overcoat is lost through abrasion or chemical attack, the loss will not significantly affect the optical properties of the coating. The resulting film stack exhibits significantly enhanced durability as compared to a film stack without such an overcoat. In a preferred embodiment, a film stack of the invention includes at least one reflective metal layer, an outer, scratch-resistant metal oxide overcoat, and a metal oxide layer between the silver layer and the overcoat which is less scratch resistant than the overcoat.

13 Claims, 1 Drawing Sheet

ABRASION-RESISTANT OVERCOAT FOR COATED SUBSTRATES

FIELD OF THE INVENTION

The present invention generally relates to coatings for substrates and particularly relates to substantially transparent coatings for transparent substrates such as glass.

BACKGROUND OF THE INVENTION

High visible transmittance, low emissivity coatings upon transparent substrates such as glass are characterized by their ability to transmit visible light while minimizing the transmittance of other wavelengths of light, such as light in the infrared spectrum. This characteristic is particularly useful in applications where it is desirable to minimize radiative heat transfer without impairing visibility, such as in architectural glass or automobile windows. For asthetic reasons, in many such applications it is important to maintain reflectance relatively consistent throughout the visible spectrum so that the coating has a "neutral" color, i.e., is essentially colorless.

Generally speaking, such high transmittance, low emissivity coatings comprise a "film stack" having a thin metallic layer or film with high infrared reflectance and low transmissivity disposed between metal oxide layers. The metallic layer may be virtually any reflective metal, such as silver, copper or gold, with silver being frequently used. Metal oxides useful in high transmittance, low emissivity films include oxides of titanium, hafnium, zirconium, niobium, zinc, bismuth, indium and tin. Prior art systems have also employed oxides of metal alloys, such as zinc stannate or oxides of indium/tin alloys.

The metal oxide layers of such coatings serve two important functions. First, they serve to reduce the visible reflection of the film stack to enhance transmittance. The metal oxides used in these layers should therefore have a relatively high index of refraction, e.g., on the order of 2.0 or more, in order to achieve this end. Second, they should serve to protect the reflective metal layer from the environment. The film stack is frequently isolated from contact with the environment, as by disposing the film stack between two spaced panes of glass in a composite window structure. However, when these products are being assembled, the film stack is frequently subjected to relatively harsh conditions, such as by handling, shipping or washing of the panes prior to assembly.

A variety of attempts have been made to enhance the ability of the metal oxide layers to protect the reflective metal layer. For instance, Gillery et al. teach the use of titanium oxide as a protective overcoat in U.S. Pat. No. 4,786,563, the teachings of which are incorporated herein by reference. Gillery et al. explain that titanium oxides achieve the best results, but that such an overcoat could be formed of a metal rather than a metal oxide; titanium and alloys of iron or nickel are listed as prime candidates for such a metal layer. Gillery also teaches that certain other oxides simply lack the requisite durability to be used as such a protective overcoat. Zinc oxide, bismuth oxide and tin oxide are all listed as having undesirable properties, such as a lack of durability, which make them unsuitable for a protective overcoat.

However, it has been found that the use of a titanium oxide overcoat such as that taught by Gillery et al. is particularly prone to scratching or abrasion during shipping and washing operations. When coated substrates are washed before being assembled into a final product, the film stack comes into physical contact with a washing solution apparatus. It has been found that such a washing stage can physically abrade an overcoat of titanium oxide or the like, noticeably degrading the appearance of the finished article.

It would therefore be desirable to provide a film stack which provides suitable protection for the underlying metal layer, but can withstand the rigors of normal handling associated with such substrates.

SUMMARY OF THE INVENTION

The present invention provides a high transmittance, low emissivity film stack having an outer layer of an oxide of a metal chosen from the group of zinc, tin, indium, or bismuth, or an alloy including one or more of these metals, the oxide being applied in a thickness sufficiently low as to have no significant affect upon the optical properties of the coated substrate. That is, if the outer oxide layer is lost through abrasion or chemical attack, the loss will not significantly affect the optical properties of the coating. The resulting film stack exhibits significantly enhanced durability as compared to a film stack without such an overcoat. In a preferred embodiment, a film stack of the invention comprises at least one reflective metal layer, an outer, scratch-resistant metal oxide overcoat, and a metal oxide layer between the silver layer and the overcoat and which is less scratch resistant than the overcoat.

DETAILED DESCRIPTION OF THE PREFERRED EMBODIMENT

Figure 1:
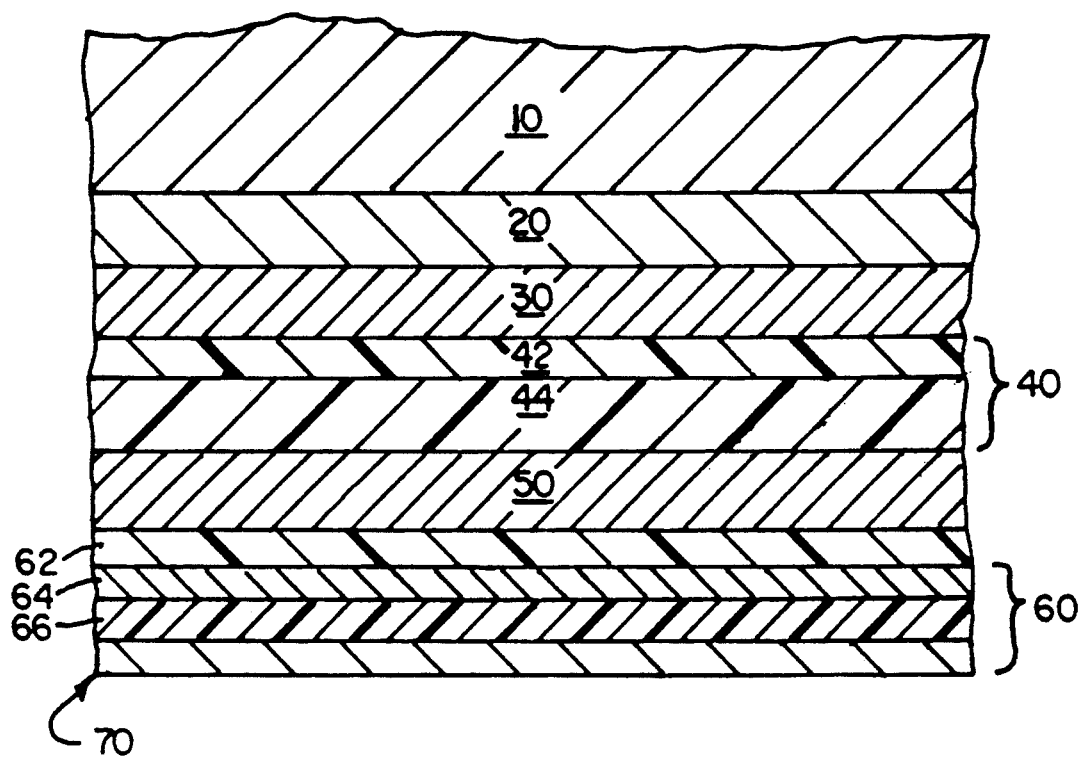
FIG. 1 is a schematic view of a substrate coated with a film stack of one embodiment of the present invention.

An abrasion-resistant overcoat of the present invention can be used advantageously with any of a wide variety of film stacks on nearly any substrate. One such film stack providing a high transmittance, low emissivity coating is schematically represented in FIG. 1. This film stack is applied over a transparent substrate 10, which may be of any desired material such as glass. The present invention has particular utility in coating glass panes for use as windows in architectural or automobile related applications Although the reflective metal layer of the film stack could be applied directly to the surface of the substrate, it is preferred that an inner metal oxide layer 20 be employed. This metal oxide layer should have a sufficient optical thickness (actual thickness multiplied by the material's index of refraction) to reduce or substantially eliminate any reflectance which may arise from the interface between the metal layer 30 and the substrate 10. Appropriate inner metal oxide layers include zinc oxide, tin oxide, indium oxide, bismuth oxide, titanium oxide, hafnium oxide, and zirconium oxide, and combinations of such oxides. In a particularly preferred embodiment, this inner metal oxide layer 20 is formed of zinc oxide applied at a thickness of about 300–700 Å.

This inner metal oxide layer, as well as all the additional layers of this film stack described below, are preferably deposited by magnetron sputtering. Magnetron sputtering techniques are well known in the art and need not be discussed in detail here. However, it is generally preferred that the oxides of the present film stack be applied by sputtering of a metal target in a reactive oxygen atmosphere rather than sputtering a target formed of the oxide itself. It should also be noted that, if so desired, two or more contiguous layers of different metal oxides may be used instead of a single metal oxide layer.

A reflective metal layer 30 may be applied directly over the inner metal oxide layer 20. As noted above, any suitable metal layer which effectively reflects infrared radiation without significantly affecting visible transmittance will be suitable for this metal layer. Although gold or copper could be used, silver is preferred both for economic reasons and because color neutrality of the film stack can be fairly readily achieved. In the embodiment shown, wherein two discrete reflective metal layers are employed as described below, it is preferred that the inner reflective metal layer 30 have a thickness on the order of about 100 to about 150 A, with a thickness of approximately 125 A being preferred. However, a film stack of the invention may include only a single reflective metal layer, omitting layers 40-50 of FIG. 1. In such a single metal layer film stack, a layer of silver is preferably applied at a thickness of about 100 to about 175 A, with a thickness of approximately 140 A being particularly preferred.

In the embodiment shown in FIG. 1 an outer reflective metal layer 50 is also included. As is known in the art, it is desirable to include an intermediate metal oxide layer 40 disposed between the inner and outer reflective metal layers (30, 50 respectively). The intermediate metal oxide layer 40 may be of any desirable composition. The metal oxides which have been found to work well for such an intermediate layer are substantially the same as those which have proven effective for the inner metal oxide layer 20 set forth above.

In the particularly preferred embodiment shown in FIG. 1, the layer 40 between the silver layers is replaced with two layers, an intermediate metal oxide layer 44 and a barrier layer 42 applied directly to the metal film layer 30, the latter advantageously being formed of titanium oxide. The layer 42 is formed by the application of thin layer of titanium metal directly to the reflective metal layer 30. When the overlying intermediate metal oxide layer 44 is applied, the titanium metal layer 42 oxidizes to form titanium oxide and thus serves as a sacrificial layer to protect the underlying reflective layer 30 during the sputtering of the metal oxide layer 44. Applying the titanium metal at the thickness of approximately 20 A has been found to work well.

The intermediate metal oxide layer 44 may be formed of any suitable metal oxide, as noted above. A zinc oxide layer of about 700 to about 1200 A thick, with a thickness of approximately 900 A being preferred, has been found to work quite well.

In the embodiment schematically depicted in FIG. 1, an outer reflective metal layer 50 is also employed. The metal of this reflective layer may be the same as or different from the metal used in the inner reflective metal layer 30. The thickness of this second reflective metal layer should be selected such that the combined action of the inner and outer reflective metal layers achieves the desired visible transmittance and emissivity properties for the film stack. With an inner reflective layer 30 of silver at approximately 125 A, it is preferred that the outer reflective layer 50 be between about 125 and about 175 A thick, with a thickness of approximately 150 A being preferred. Using such thicknesses for the inner and outer metal layers 30, 50 has been found to achieve rather low emissivity while maintaining relatively high visible transmittance and color neutrality.

An outer metal oxide layer 60, shown as a composite of oxide layers, is applied over a second sacrificial layer 62 identical to layer 42. It should be understood that an outer metal oxide stack 60 is employed regardless of the number of reflective metal layers utilized in the film stack. For example, if only a single reflective metal layer, such as layer 30 in FIG. 1, is employed, the outer oxide stack 60 may be applied directly over the sacrificial layer. Alternatively, if additional reflective metal layers were to be employed, such as in a film stack which employs three or more reflective metal layers, the outer metal oxide stack 60 should be applied over the outermost of the sacrificial metal layers.

The outer metal oxide stack 60 according to the present invention may be of any suitable construction, provided that an abrasion-resistant overcoat 70, described below, is included as its outermost layer.

If so desired, the protective overcoat layer 70 of the invention could be applied directly to the layer 62 if the latter layer was sufficiently thick. However, in order to ensure that visible reflectance of the film stack is minimized and to protect the integrity of the underlying metal layer or layers, it is preferred that the outer metal oxide stack 60 have a thickness greater than that commonly associated with the sacrificial layers. The metal oxide disposed between the barrier layer 62 and the overcoat 70 may be varied widely in both composition and thickness to meet the specific performance parameters desired for the film stack. For instance, a single layer of an oxide of titanium may be employed.

However, in the preferred embodiment shown in FIG. 1, two metal oxide layers 64 and 66 are disposed between the layer 62 and the overcoat 70. It is desirable to form the first and second layer 64, 66 of different metal oxides rather than forming both layers of the same composition.

One of the two layers 64, 66 desirably comprises an oxide of titanium, hafnium, zirconium or niobium or an alloy of such a metal, with titanium oxide being particularly preferred since it provides additional chemical resistance to the film stack, protecting the underlying metal layers from the attack of chemical agents. The thickness of this layer can be varied within a rather broad range. It is preferred that this layer be at least about 5-10 A thick in order to achieve an effective chemical barrier, but this layer can be increased significantly beyond that minimum thickness. Titanium, hafnium, zirconium and niobium sputter relatively slowly and oxide layers of such metals therefore tend to be relatively expensive to apply. It is therefore economically desirable to apply such an oxide layer at a thickness of no more than about 200 A, with no more than about 100 A being preferred. In a preferred embodiment, this layer is formed of titanium oxide at a thickness of between about 50 and 100 A, with about 55-60 A being particularly preferred.

The other of the two metal oxide layers 64, 66 in the outer stack 60 may be formed from an oxide of any desired metal. It has been found that zinc oxide, tin oxide, indium oxide and bismuth oxide work quite well in this application. In one preferred embodiment, this layer is formed of zinc oxide at a thickness of between about 200 and about 500 A, with a thickness of about 300 A being preferred. Although the relative order of the titanium oxide and zinc oxide layers 64, 66 may be varied, in this embodiment a layer 64 of zinc oxide is applied over a titanium oxide sacrificial layer 62, and titanium oxide is applied over the zinc oxide layer as oxide layer 66.

It is to be understood, though, that one need not limit the number of different metal oxide layers between the barrier layer 62 and the overcoat 70 to merely one or two layers. In an alternative embodiment (not shown), four oxide layers are disposed between the barrier and the overcoat. In particular, a first zinc oxide layer of between about 100 and about 150 A, with about 125 A being preferred, is applied over a 25 A titanium oxide barrier layer 62. Over this first zinc oxide layer, a layer of titanium oxide is sputtered on at a thickness of between about 30 and about 50 A, with 40 A being preferred. Next, a second coating of zinc oxide, which may have a thickness approximately equal to the previous zinc oxide layer, is sputtered over the titanium layer. Finally, a layer of tin oxide is deposited over this second zinc oxide layer at a thickness of between about 20 and about 60 A, with approximately 50 A being preferred. This has been found to yield an outer metal oxide stack 60 which particularly effectively protects the underlying metal layers 30, 50 from chemical attack.

As noted above, an outer metal oxide stack of the present invention includes an outer overcoat 70 applied as the outermost layer of the film stack of the invention, i.e., disposed farthest away from the inner metal oxide layer 20. The overcoat 70 is adapted to protect the underlying layers of the film stack from abrasions. In many instances, a substrate is coated at one location and must then be shipped to another location for assembly into a final product. For instance, glass panes may be provided with a high transmittance, low emissivity coating at a coating facility and then be shipped to another facility for assembly into insulative glass window units. Although it is possible to ship coated substrates relatively short distances without unduly damaging coatings, when these substrates are shipped over long distances the product losses due to abrasion can be quite high.

For example, a glass product provided with a coating substantially as outlined above but omitting the overcoat 70 (titanium oxide serving as the outermost layer) was transported from a coating facility to an assembly plant less than 1,000 miles away; nearly 80% of the shipment was considered to be unacceptable for use in insulative glass units because of scratching and abrading of the coatings. By applying an overcoat 70 of the invention to a second shipment of glass otherwise having substantially the same film stack, the number of unacceptably coated panes was comparable to that associated with very short-range shipping and is within acceptable, expected ranges of manufacturing losses. This second shipment of glass including an overcoat showed very few scratches or other abrasions and were visibly better than the prior shipment which omitted the overcoat.

The instant overcoat 70 desirably is formed of a material with a greater mechanical durability, i.e., a material which better resists abrasion or scratching, than the material immediately underlying this overcoat. Materials which exhibit relatively high mechanical durability when sputtered on as an overcoat of the invention include oxides of zinc, tin, indium, bismuth, or oxides of alloys including such metals, such as zinc stannate. Due to its relatively low cost and high sputtering rate, zinc oxide applied by magnetron sputtering of a zinc target in a reactive oxygen atmosphere is particularly preferred.

Unfortunately, it has been found that such mechanically durable metal oxide layers tend to be more susceptible to chemical attack than other more conventional outer layers such as titanium oxide. When coated glass panes are handled by workers assembling final glass products, the workers often touch the film stack. Sweat on the workers' hands or chemicals used in the assembly process contact the film stack and can visibly mottle or otherwise degrade the film. Additionally, such panes are frequently washed before assembly; the chemicals in the washing solutions can also adversely affect the film.

Therefore, it is desirable to apply an overcoat 70 of the invention at a thickness which does not substantially affect the optical properties, and particularly the color, of the coated substrate. If a film stack of the invention is subjected to a harsh chemical environment which degrades the overcoat, the effects on the overcoat will not significantly affect the optical properties of the film or the coated substrate. Even if the washing process were so harsh as to wash away the entire overcoat from the film stack, the optical properties of the film would not be substantially changed, but the overcoat would nonetheless serve to protect the underlying film from abrasion during handling, shipping or the like prior to washing.

The thickness at which an overcoat of the invention is applied will vary according to the material used in the overcoat. The maximum thickness of the overcoat will be less for materials with a relatively high index of refraction than for metals with a relatively low index of refraction in order to ensure that the overcoat, if damaged or even if completely lost, will not significantly affect the optical properties of the film. It has been found that an overcoat having an optical thickness (i.e. physical thickness times the index of refraction) of between about 10 A and about 40 A can provide suitable abrasion resistance without significantly affecting the optical properties. Thus, an overcoat of zinc oxide, which has an index of refraction of very near 2.0, is advantageously applied at about 5 A to about 20 A thick.

While a preferred embodiment of the present invention has been described, it should be understood that various changes, adaptations and modifications may be made therein without departing from the spirit of the invention and the scope of the appended claims.

What is claimed is:

1. A film stack applied on a substrate comprising a first metal oxide layer, at least one reflective metal layer, a second metal oxide layer disposed away from said first metal oxide layer, and an abrasion-resistant overcoat defining the outermost layer of the film stack, the overcoat being formed of an oxide of a metal selected from the group consisting of zinc, tin, indium, bismuth, and alloys thereof applied at a thickness which does not substantially affect the optical properties of said film stack.

2. The film stack of claim 1 wherein said overcoat is zinc oxide.

3. The film stack of claim 1 wherein said overcoat comprises an oxide of a metal chosen from the group consisting of zinc, tin, indium, and bismuth.

4. The film stack of claim 1 wherein said metal oxide of said overcoat is applied at an optical thickness of between about 10 A and about 40 A.

5. The film stack of claim 1 wherein the second metal oxide layer comprises an oxide of titanium.

6. The film stack of claim 2 wherein said zinc oxide is applied at a thickness of between about 5 A and about 20 A.

7. A coated substrate comprising a substantially transparent substrate, a reflective metal layer, a first metal oxide layer disposed between the substrate and the metal layer, a second metal oxide layer applied over the metal layer at a location disposed away from the substrate, and an abrasion-resistant overcoat defining the outermost layer of the film stack, the overcoat being formed of an oxide of a metal selected from the group consisting of zinc, tin, indium, bismuth, and an alloy of zinc, tin, indium or bismuth applied at a thickness which does not substantially affect the optical properties of said coated substrate.

8. The coated substrate of claim 1 wherein said substrate is glass.

9. The coated substrate of claim 7 wherein said overcoat comprises an oxide of a metal chosen from the group of zinc, tin, indium, bismuth or an alloy of zinc, tin, indium or bismuth.

10. The coated substrate of claim 9 wherein said metal oxide is applied at an optical thickness of between about 10 A and about 40 A.

11. The coated substrate of claim 7 wherein said overcoat comprises an oxide of zinc or of an alloy including zinc.

12. The coated substrate of claim 1 wherein said overcoat comprises zinc oxide.

13. The coated substrate of claim 12 wherein said zinc oxide is applied at a thickness of between about 5 A and about 20 A.

* * * * *

UNITED STATES PATENT AND TRADEMARK OFFICE
CERTIFICATE OF CORRECTION

PATENT NO.    : 5,296,302
DATED         : March 12, 1992
INVENTOR(S)   : O'Shaughnessy, et al.

It is certified that error appears in the above-identified patent and that said Letters Patent is hereby corrected as shown below:

In Col. 4, Line 6, delete "layer" and add --stack--.
In Col. 8, Line 8, delete "metal oxide" and add --overcoat--.

Signed and Sealed this

Twenty-ninth Day of February, 2000

*Attest:*

Q. TODD DICKINSON

*Attesting Officer*    *Commissioner of Patents and Trademarks*